(12) United States Patent
Fay et al.

(10) Patent No.: US 10,943,794 B2
(45) Date of Patent: Mar. 9, 2021

(54) SEMICONDUCTOR DEVICE ASSEMBLY WITH PILLAR ARRAY AND TEST ABILITY

(71) Applicant: Micron Technology, Inc., Boise, ID (US)

(72) Inventors: Owen R. Fay, Meridian, ID (US); Akshay N. Singh, Boise, ID (US); Kyle K. Kirby, Eagle, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/513,466

(22) Filed: Jul. 16, 2019

(65) Prior Publication Data

US 2019/0341270 A1 Nov. 7, 2019

Related U.S. Application Data

(62) Division of application No. 15/830,839, filed on Dec. 4, 2017, now Pat. No. 10,529,592.

(51) Int. Cl.
*H01L 21/48* (2006.01)
*H01L 23/48* (2006.01)
(Continued)

(52) U.S. Cl.
CPC .......... *H01L 21/486* (2013.01); *H01L 21/481* (2013.01); *H01L 22/20* (2013.01);
(Continued)

(58) Field of Classification Search
CPC . H01L 21/486; H01L 21/481; H01L 21/4853; H01L 21/76898; H01L 23/481;
(Continued)

(56) References Cited

U.S. PATENT DOCUMENTS 6,828,175 B2 * 12/2004 Wood ............... H01L 25/50
438/113
7,898,086 B2 3/2011 Egawa
(Continued)

OTHER PUBLICATIONS

US Patent and Trademark Office; Office Action; U.S. Appl. No. 15/830,839; dated Aug. 6, 2018.

*Primary Examiner* — Stephen M Bradley
*Assistant Examiner* — Gustavo G Ramallo
(74) *Attorney, Agent, or Firm* — Parsons Behle & Latimer

(57) ABSTRACT

A semiconductor device assembly and method of forming a semiconductor device assembly that includes a first substrate, a second substrate disposed over the first substrate, at least one interconnect between the substrates, and at least one pillar extending from the bottom surface of the first substrate. The pillar is electrically connected to the interconnect and is located adjacent to a side of the first substrate. The pillar is formed by filling a via through the substrate with a conductive material. The first substrate may include an array of pillars extending from the bottom surface adjacent to a side of the substrate that are formed from a plurality of filled vias. The substrate may include a test pad located on the bottom surface or located on the top surface. The pillars may include a removable coating enabling the pillars to be probed without damaging the inner conductive portion of the pillar.

8 Claims, 5 Drawing Sheets

(51) Int. Cl.
  *H01L 21/66* (2006.01)
  *H01L 23/498* (2006.01)
  *H01L 25/065* (2006.01)
  *H01L 23/00* (2006.01)

(52) U.S. Cl.
  CPC ............ *H01L 22/32* (2013.01); *H01L 23/481* (2013.01); *H01L 23/49827* (2013.01); *H01L 25/0657* (2013.01); H01L 24/13 (2013.01); H01L 24/16 (2013.01); H01L 24/81 (2013.01); H01L 2224/0401 (2013.01); H01L 2224/0557 (2013.01); H01L 2224/13147 (2013.01); H01L 2224/16145 (2013.01); H01L 2224/16146 (2013.01); H01L 2224/16147 (2013.01); H01L 2224/16238 (2013.01); H01L 2224/32145 (2013.01); H01L 2224/48227 (2013.01); H01L 2224/73265 (2013.01); H01L 2224/81191 (2013.01); H01L 2224/81192 (2013.01); H01L 2225/06513 (2013.01); H01L 2225/06517 (2013.01); H01L 2225/06541 (2013.01); H01L 2225/06548 (2013.01); H01L 2225/06565 (2013.01); H01L 2225/06596 (2013.01); H01L 2924/10253 (2013.01); H01L 2924/1434 (2013.01); H01L 2924/157 (2013.01); H01L 2924/15192 (2013.01); H01L 2924/15312 (2013.01)

(58) Field of Classification Search
  CPC ......... H01L 23/49827; H01L 23/49822; H01L 23/49811
  See application file for complete search history.

(56) References Cited

U.S. PATENT DOCUMENTS

| | | |
|---|---|---|
| 9,054,095 B2 | 6/2015 | Pagaila |
| 2008/0157330 A1 | 7/2008 | Kroehnert et al. |
| 2008/0224298 A1 | 9/2008 | Corisis et al. |
| 2010/0019390 A1 | 1/2010 | Jung |
| 2011/0233702 A1 | 9/2011 | Takahashi et al. |
| 2012/0306097 A1 | 12/2012 | Kim et al. |
| 2013/0011938 A1* | 1/2013 | Tsao ................. H01L 21/31053 438/8 |
| 2013/0020468 A1 | 1/2013 | Mitsuhashi et al. |
| 2014/0321803 A1 | 10/2014 | Thacker et al. |
| 2014/0321804 A1 | 10/2014 | Thacker et al. |
| 2015/0226784 A1 | 8/2015 | Hatakeyama |
| 2016/0084905 A1 | 3/2016 | Gandhi et al. |
| 2016/0293519 A1 | 10/2016 | Gandhi et al. |
| 2017/0084576 A1 | 2/2017 | Yu et al. |
| 2017/0263518 A1 | 9/2017 | Yu et al. |
| 2017/0358558 A1 | 12/2017 | Lee |
| 2018/0040658 A1 | 2/2018 | Kang et al. |
| 2018/0076156 A1 | 3/2018 | Kim et al. |
| 2018/0096735 A1 | 4/2018 | Pappu |
| 2018/0096979 A1 | 4/2018 | Pappu et al. |
| 2018/0102298 A1 | 4/2018 | Chen et al. |
| 2018/0174974 A1 | 6/2018 | Kim et al. |
| 2019/0172725 A1* | 6/2019 | Fay ................. H01L 23/49811 |

\* cited by examiner

SEMICONDUCTOR DEVICE ASSEMBLY WITH PILLAR ARRAY AND TEST ABILITY

RELATED APPLICATIONS

The present application is a divisional patent application of U.S. patent application Ser. No. 15/830,839 entitled Semiconductor Device Assembly with Pillar Array filed on Dec. 4, 2017, which is incorporated by reference herein in its entirety.

FIELD

The embodiments described herein relate to semiconductor devices, semiconductor device assemblies, and methods of providing such semiconductor devices and semiconductor device assemblies. The present disclosure relates to a semiconductor device having a plurality of pillars extending from a bottom surface that are formed from vias filled with a conductive material, also referred to herein as a through silicon via (TSV). The vias may be filled with copper, tungsten, poly silicon, or the like. The plurality of pillars may be in a rectangular array positioned adjacent to a side of the semiconductor device.

BACKGROUND

Semiconductor device assemblies, including, but not limited to, memory chips, microprocessor chips, imager chips, and the like, typically include a semiconductor device, such as a die, mounted on a substrate. The semiconductor device assembly may include various functional features, such as memory cells, processor circuits, and imager devices, and may include bond pads that are electrically connected to the functional features of the semiconductor device assembly. The semiconductor device assembly may include semiconductor devices stacked upon and electrically connected to one another by individual interconnects between adjacent devices within a package.

Various methods and/or techniques may be employed to electrically interconnect adjacent semiconductor devices and/or substrates in a semiconductor device assembly. For example, individual interconnects may be formed by reflowing tin-silver (SnAg), also known as solder, to connect a pillar to a pad. Typically, the pillar may extend down from a bottom surface of a semiconductor device towards a pad formed on the top surface of another semiconductor device or substrate. A grid array of solder balls may be used to connect a semiconductor device assembly to a circuit board or other external device. However, a grid array of solder balls may not permit the connection of a semiconductor device assembly to a device in all applications. Further, it may be beneficial to provide semiconductor device assembly that permits test ability while connected to an external device. Additional drawbacks and disadvantages may exist.

Figure 1:
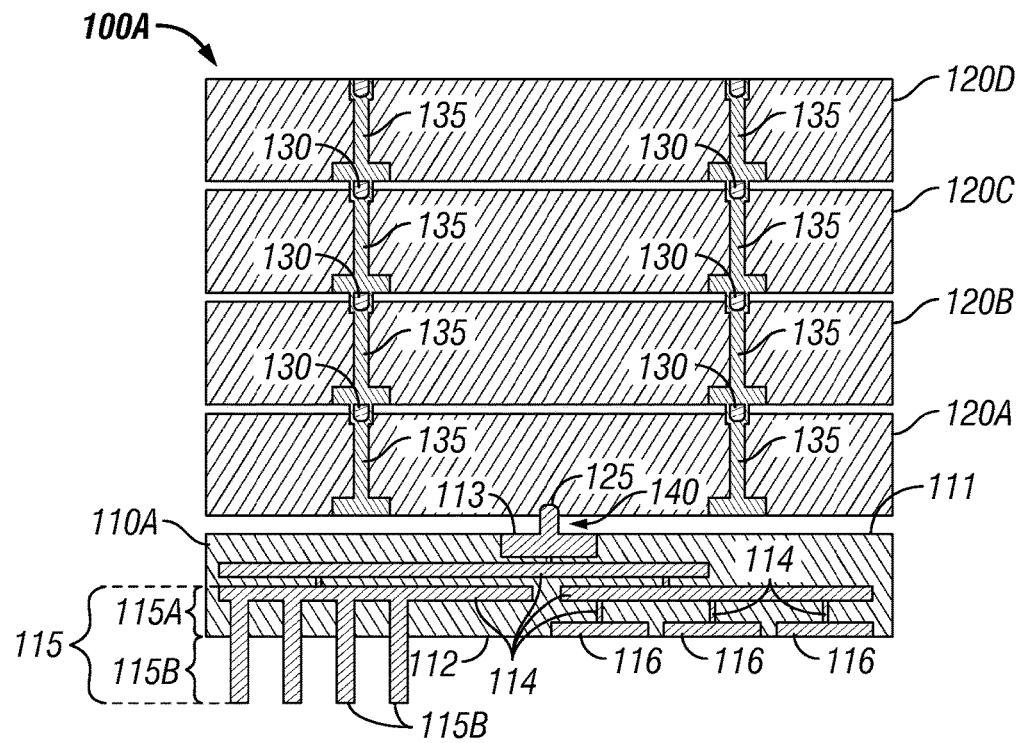
FIG. 1 is a cross-sectional schematic of an embodiment of a semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, and methods of making and/or operating semiconductor devices and/or semiconductor device assemblies. In one embodiment of the disclosure a semiconductor device assembly comprises a first substrate having a first surface and a second surface opposite the first surface with a second substrate disposed over the first substrate, the second substrate having a first surface and a second surface opposite the first surface. The semiconductor device assembly includes at least one interconnect between the second surface of the second substrate and the first surface of the first substrate and at least one pillar extending from the second surface of the first substrate, the at least one pillar being comprised of copper, or the like, being electrically connected to the at least one interconnect, and being positioned adjacent to a side of the first substrate.

In one embodiment of the disclosure a semiconductor device comprises a substrate having a top surface and a bottom surface opposite the top surface with at least one pad on the top surface of the substrate, the pad being configured to connect to a pillar from a semiconductor device. The semiconductor device comprising a plurality of pillars extending from the bottom surface of the substrate, each pillar being comprised of copper, or the like, being positioned in a rectangular array positioned adjacent to a side of the substrate, and being electrically connected to the at least one pad.

One embodiment of the disclosure is a method of making a semiconductor device comprising providing a silicon substrate having a first surface and a second surface opposite the first surface. The method comprising forming a first layer on the silicon substrate and forming a second layer on the first layer. The first layer may be comprised of a plurality of layers and the second layer may be comprised of a plurality of layers as would be appreciated by one of ordinary skill in the art having the benefit of this disclosure. The method comprises creating at least one TSV that extends from the second layer, through the first layer, and into the silicon substrate. The method comprises filling the at least one TSV with a conductive material, such as copper, or the like, with the at least on TSV being positioned adjacent to a side of the silicon substrate. The method comprises forming at least a third layer on the second layer, the third layer including at least one pad configured to connect to a semiconductor device and interconnections between the at least one filled TSV and the at least one pad. The method comprises removing silicon from the second surface of the silicon substrate to expose a portion of the at least one filed TSV.

FIG. 1 shows an embodiment of a semiconductor device assembly 100A that includes a first substrate 110A and a second substrate 120A that is disposed over the first substrate 110A. The first substrate 110A includes a first or top surface 111 and a second or bottom surface 112 opposite the first surface 111. The first substrate 110A includes a pad 113 on the first surface 111 and a plurality of pads 116 on the second surface 112. A plurality of pillars 115B extend from the second surface 112 of the first substrate 110A with a portion of the pillars 115A positioned within the first substrate 110A. The pillars 115A, 115B are formed by filling TSVs in the first substrate 110A with a conductive material, as discussed herein. The pillars 115A, 115B are positioned adjacent to a side of the first substrate 110A, as shown in FIG. 1. Interconnections 114 within the first substrate 110A electrically connect the pillars 115A, 115B with the pad 113 on the first surface 111 of the first substrate 110A. Likewise, the interconnections 114 within the first substrate 110A electrically connect the pads 116 on the second surface 112 of the first substrate 110A with the pad 113 on the first surface 111 of the first substrate 110A.

The second substrate 120A includes a first or top surface and a second or bottom surface opposite of the first surface. At least one pillar 125 extends from the second surface of the second substrate 120A. An interconnect 140 is formed between the pillar 125 of the second substrate 120A and the pad 113 located on the first surface 111 of the first substrate 110A. The interconnect 140 electrically connects the first substrate 110A with the second substrate 120A.

A third substrate 120B is disposed over the second substrate 120A with vias 135 and interconnects 130 electrically connecting the third substrate 120B to the second substrate 120A. Likewise, A fourth substrate 120C is disposed over the third substrate 120B with vias 135 and interconnects 130 electrically connecting the fourth substrate 120C to the third substrate 120B. Similarly, A fifth substrate 120D is disposed over the fourth substrate 120C with vias 135 and interconnects 130 electrically connecting the fifth substrate 120D to the fourth substrate 120C. The electrical interconnects between the substrates 110A, 120A, 120B, 120C, 120D are shown schematically for clarity and may be varied as would be appreciated by one of ordinary skill in the art having the benefit of this disclosure. It should also be noted that semiconductor device assembly 100A may include the first substrate 110A and the second substrate 120A alone.

As would be appreciated by one of ordinary skill in the art having the benefit of this disclosure, the interconnections 130, 140 electrically connect each of the substrates 110A, 120A, 120B, 120C, 120D together. The pads 116 located on the second surface 112 of the first substrate 110A may be test pads configured to permit testing of the semiconductor device assembly 100A. For example, a probe may contact one of the pads 116 to test the operational functionality of any one of the substrates 110A, 120A, 120B, 120C, 120D of the semiconductor device assembly 100A. The first substrate 110A may be a silicon substrate. The second substrate 120A, third substrate 120B, fourth substrate 120C, and fifth substrate 120D may be various semiconductor devices. For example, the second substrate 120A, third substrate 120B, fourth substrate 120C, and fifth substrate 120D may comprise a memory stack. The number, configuration, size, and/or location of the substrates may be varied depending on the application as would be appreciated by one of ordinary skill in the art having the benefit of this disclosure. For example, the semiconductor device assembly 100A may comprise more or less substrates than shown. Likewise, the number, size, location, and/or configuration of the pillars, pads, and/or interconnections are shown for illustrative purposes and may be varied depending on application as would be appreciated by one of ordinary skill in the art having the benefit of this disclosure.

Figure 2:
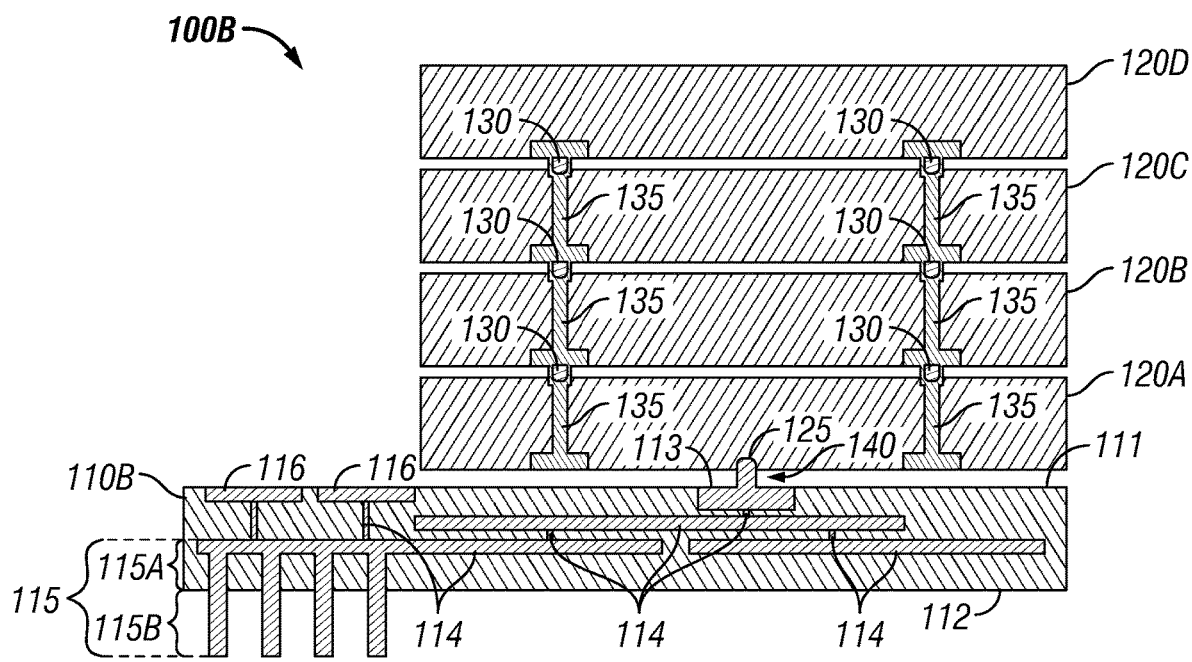
FIG. 2 is a cross-sectional schematic of an embodiment of a semiconductor device assembly.

FIG. 2 shows an embodiment of a semiconductor device assembly 100B that includes a first substrate 110B and a second substrate 120A that is disposed over the first substrate 110B. The first substrate 110B includes a first or top surface 111 and a second or bottom surface 112 opposite the first surface 111. The first substrate 110B includes a pad 113 on the first surface 111. The first substrate 110B also includes a plurality of pads 116 on the first surface 111. A plurality of pillars 115B extend from the second surface 112 of the first substrate 110B with a portion of the pillars 115A positioned within the first substrate 110B. The pillars 115A, 115B are formed by filling TSVs in the first substrate 110B with a conductive material, as discussed herein. The pillars 115A, 115B are positioned adjacent to a side of the first substrate 110B, as shown in FIG. 2. Interconnections 114 within the first substrate 110B electrically connect the pillars 115A, 115B with the pad 113 on the first surface 111 of the first substrate 110B. Likewise, the interconnections 114 within the first substrate 110B electrically connect the pads 116 on the first surface 111 of the first substrate 110B with the pad 113 on the first surface 111 of the first substrate 110B.

As discussed above, at least one pillar 125 extends from the second substrate 120A to form an interconnect 140 between the pillar 125 of the second substrate 120A and the pad 113 located on the first surface 111 of the first substrate 110B. The interconnect 140 electrically connects the first substrate 110B with the second substrate 120A. Vias 135 and interconnects 130 electrically connect a third substrate 120B, a fourth substrate 120C, and a fifth substrate 120D to each other and to the first substrate 110B. As shown in FIG. 2, the fifth substrate 120D may not include vias 135. Is should be noted that semiconductor device assembly 100B may include the first substrate 110B and second substrate 120A alone.

As would be appreciated by one of ordinary skill in the art having the benefit of this disclosure, the interconnections 130, 140 electrically connect each of the substrates 110B, 120A, 120B, 120C, 120D together. The pads 116 located on the first surface 111 of the first substrate 110B may be test pads configured to permit testing of the semiconductor device assembly 100B. For example, a probe may contact one of the pads 116 to test the operational functionality of any one of the substrates 110B, 120A, 120B, 120C, 120D of the semiconductor device assembly 100B. The first substrate 110B may be a silicon substrate. The second substrate 120A, third substrate 120B, fourth substrate 120C, and fifth substrate 120D may be various semiconductor devices. For example, the second substrate 120A, third substrate 120B, fourth substrate 120C, and fifth substrate 120D may comprise a memory stack. The number, configuration, size, and/or location of the substrates may be varied depending on the application as would be appreciated by one of ordinary skill in the art having the benefit of this disclosure. For example, the semiconductor device assembly 100B may comprise more or less substrates than shown. Likewise, the number, size, location, and/or configuration of the pillars, pads, and/or interconnections are shown for illustrative purposes and may be varied depending on application as would be appreciated by one of ordinary skill in the art having the benefit of this disclosure.

Figure 3:
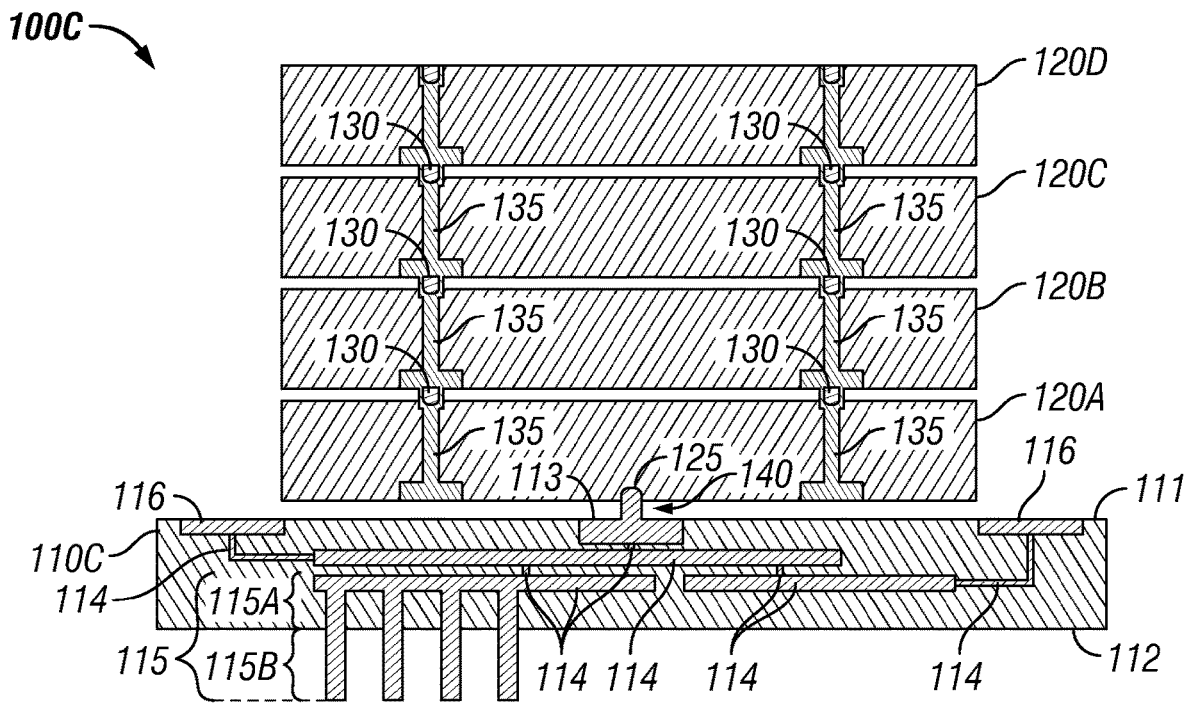
FIG. 3 is a cross-sectional schematic of an embodiment of a semiconductor device assembly.

FIG. 3 shows an embodiment of a semiconductor device assembly 100C that includes a first substrate 110C and a second substrate 120A that is disposed over the first substrate 110C. The first substrate 110C includes a first or top surface 111 and a second or bottom surface 112 opposite the first surface 111. The first substrate 110C includes a pad 113 on the first surface 111. Likewise, the first substrate 110C includes two pads 116 on the first surface 111 with the second substrate 120A positioned between the two pads 116. A plurality of pillars 115B extend from the second surface 112 of the first substrate 110C with a portion of the pillars 115A positioned within the first substrate 110C. The pillars 115A, 115B are formed by filling TSVs in the first substrate 110C with a conductive material, as discussed herein. The pillars 115A, 115B are positioned adjacent to a side of the first substrate 110C, as shown in FIG. 3. Interconnections 114 within the first substrate 110C electrically connect the pillars 115A, 115B with the pads 113, 116 on the first surface 111 of the first substrate 110C.

As discussed above, at least one pillar 125 extends from the second substrate 120A to form an interconnect 140 between the pillar 125 of the second substrate 120A and the pad 113 located on the first surface 111 of the first substrate 110C. The interconnect 140 electrically connects the first substrate 110C with the second substrate 120A. Vias 135 and interconnects 130 electrically connect a third substrate 120B, a fourth substrate 120C, and a fifth substrate 120D to each other and to the first substrate 110C.

As would be appreciated by one of ordinary skill in the art having the benefit of this disclosure, the interconnections 130, 140 electrically connect each of the substrates 110C, 120A, 120B, 120C, 120D together. The pads 116 located on the first surface 111 of the first substrate 110C may be test pads configured to permit testing of the semiconductor device assembly 100C. For example, a probe may contact one of the pads 116 to test the operational functionality of any one of the substrates 110C, 120A, 120B, 120C, 120D of the semiconductor device assembly 100C. The first substrate 110C may be a silicon substrate. The second substrate 120A, third substrate 120B, fourth substrate 120C, and fifth substrate 120D may be various semiconductor devices. For example, the second substrate 120A, third substrate 120B, fourth substrate 120C, and fifth substrate 120D may comprise a memory stack. The number, configuration, size, and/or location of the substrates may be varied depending on the application as would be appreciated by one of ordinary skill in the art having the benefit of this disclosure. For example, the semiconductor device assembly 100C may comprise more or less substrates than shown. Likewise, the number, size, location, and/or configuration of the pillars, pads, and/or interconnections are shown for illustrative purposes and may be varied depending on application as would be appreciated by one of ordinary skill in the art having the benefit of this disclosure. It should also be noted that the semiconductor device assembly 110C may include the first substrate 110C and the second substrate 120A alone.

Figure 4:
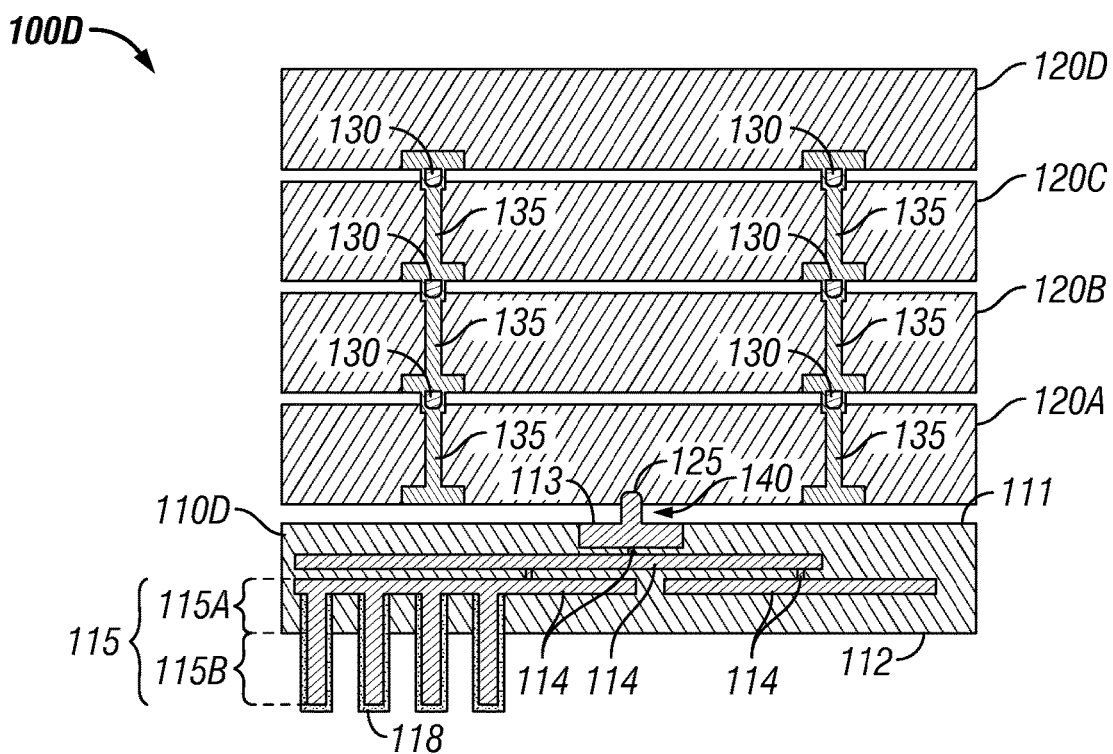
FIG. 4 is a cross-sectional schematic of an embodiment of a semiconductor device assembly.

FIG. 4 shows an embodiment of a semiconductor device assembly 100D that includes a first substrate 110D and a second substrate 120A that is disposed over the first substrate 110D. The first substrate 110D includes a first or top surface 111 and a second or bottom surface 112 opposite the first surface 111. The first substrate 110D includes a pad 113 on the first surface 111. A plurality of pillars 115B extend from the second surface 112 of the first substrate 110D with a portion of the pillars 115A positioned within the first substrate 110D. The pillars 115A, 115B are formed by filling TSVs in the first substrate 110D with a conductive material, as discussed herein. The pillars 115A, 115B are positioned adjacent to a side of the first substrate 110D, as shown in FIG. 4. Interconnections 114 within the first substrate 110D electrically connect the pillars 115A, 115B with the pad 113 on the first surface 111 of the first substrate 110D.

As discussed above, at least one pillar 125 extends from the second substrate 120D to form an interconnect 140 between the pillar 125 of the second substrate 120A and the pad 113 located on the first surface 111 of the first substrate 110D. The interconnect 140 electrically connects the first substrate 110D with the second substrate 120A. Vias 135 and interconnects 130 electrically connect a third substrate 120B, a fourth substrate 120C, and a fifth substrate 120D to each other and to the first substrate 110D. As shown in FIG. 4, the fifth substrate 120D may not include vias 135.

As would be appreciated by one of ordinary skill in the art having the benefit of this disclosure, the interconnections 130, 140 electrically connect each of the substrates 110D, 120A, 120B, 120C, 120D together. The portion 115B of the pillars 115 that extends from the second surface 112 of the first substrate 110D may include an exterior layer, or coating, 118, as discussed herein. The exterior layer 118 may enable one or more of the exposed portion 115B of the pillars 115 to be probed to permit testing of the semiconductor device assembly 100D. For example, a probe may contact an exposed portion 115B of the pillars 115 to test the operational functionality of any one of the substrates 110D, 120A, 120B, 120C, 120D of the semiconductor device assembly 100D. The exterior layer or coating 118 may be comprised of various materials that permit the probing of a pillar 115 that may be removed by subsequent processing. For example, the exterior layer 118 may be, but is not limited to, tantalum. The exterior layer 118 may permit the probing of the pillars 115 while preventing marking and/or damaging an inner conductive material portion, which may be copper, of the pillar 115.

The first substrate 110D may be a silicon substrate. The second substrate 120A, third substrate 120B, fourth substrate 120C, and fifth substrate 120D may be various semiconductor devices. For example, the second substrate 120A, third substrate 120B, fourth substrate 120C, and fifth substrate 120D may comprise a memory stack. The number, configuration, size, and/or location of the substrates may be varied depending on the application as would be appreciated by one of ordinary skill in the art having the benefit of this disclosure. For example, the semiconductor device assembly 100D may comprise more or less substrates than shown. Likewise, the number, size, location, and/or configuration of the pillars, pads, and/or interconnections are shown for illustrative purposes and may be varied depending on application as would be appreciated by one of ordinary skill in the art having the benefit of this disclosure.

Figure 5:
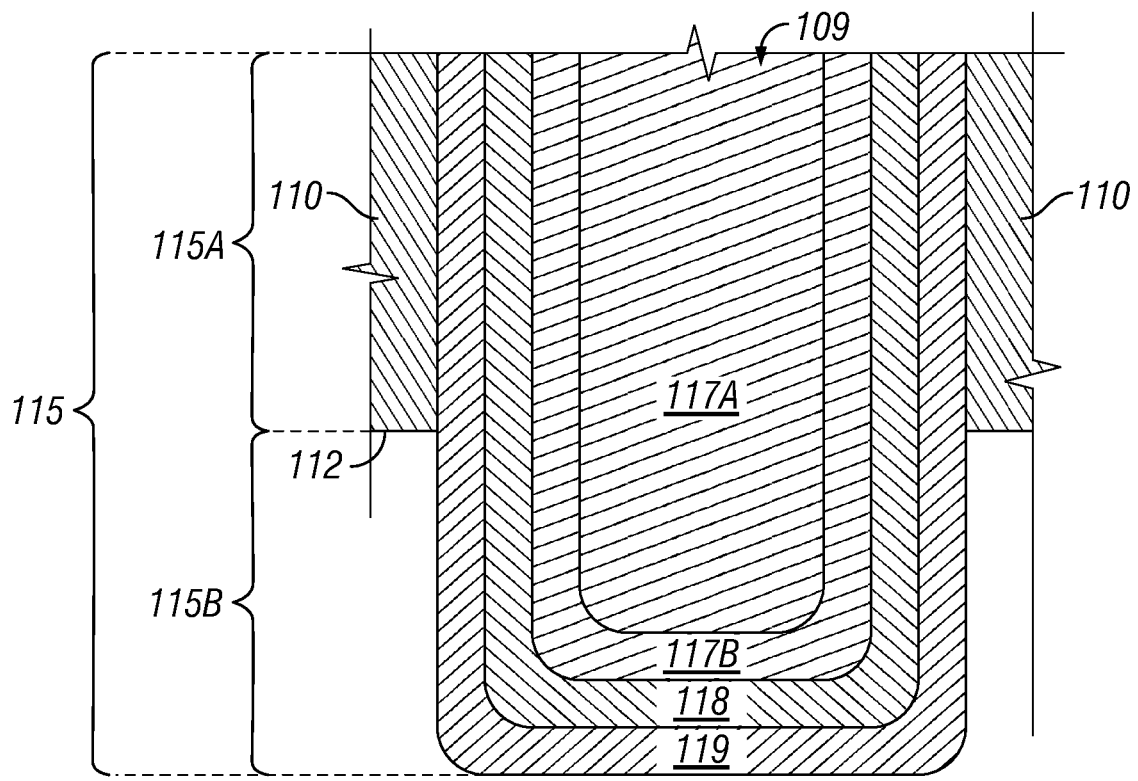
FIG. 5 is a partial cross-section schematic of an embodiment of a semiconductor device.

FIG. 5 is a partial cross-section schematic of an embodiment of a substrate 110. The substrate 110 includes a plurality of vias, or TSVs, 109 (only one shown in FIG. 5) that have been formed into the substrate 110. Various methods may be used to form a TSV 109 as would be appreciated by one of ordinary skill in the art having the benefit of this disclosure. The TSV 109 may first be coated with an oxide layer 119, which is followed by a tantalum layer 118. An inner conductive portion 117A, 117B may be filled with a conductive material, such as, but not limited to, copper, or the like. A first conductive layer 117B may first be formed in the TSV 109 followed by a second conductive layer 117A, which may be deposited into the TSV 109 by a different process than the first conductive layer 117B. For example, the first conductive layer 117B may be deposited via physical vapor deposition while the second conductive layer 117A may be deposited via electrochemical deposition. The first and second conductive layers 117A, 117B may comprise copper, tungsten, poly silicon, or the like.

A portion of the substrate 110 may be removed to expose a portion of the TSV 109, which results in an exposed portion of pillar 115B. A portion of the TSV 109, also referred to as pillar portion 115A, remains within the substrate 110. If the substrate 110 includes test pads 116 (shown in FIGS. 1-3) the oxide layer 119 and tantalum layer 118 may be removed to provide an exposed conductive pillar 115B. However, if the substrate 110 does not include any test pads 116, the oxide layer 119 may only be removed leaving the exposed portion 115B of the pillar 115, or TSV 109, to be coated with a tantalum layer 118. The tantalum layer 118 enables the probing of the exposed pillar 115B to test the substrate 110. After the substrate 110 has been tested, the tantalum layer 118 may be removed to potentially leave an unmarked exposed pillar 115B, which may be comprised of copper. The tantalum layer 118 enables testing of the substrate 110 without marking and/or damaging the inner conductive portion 117B of the pillar 115B.

Figure 6:
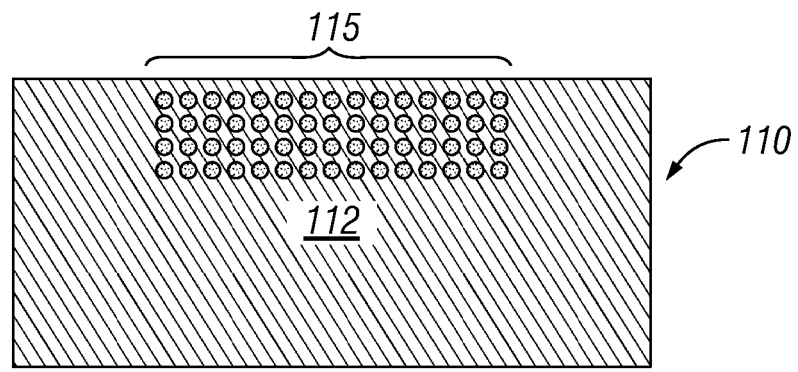
FIG. 6 is a bottom view schematic of an embodiment of a semiconductor device.

FIG. 6 is a bottom view schematic of an embodiment of a semiconductor device 110. The bottom surface 112 of the semiconductor device 110 includes a plurality of pillars 115 arranged in a high density rectangular array. As shown in FIG. 6, the rectangular array of pillars 115 is positioned adjacent to a side of the bottom surface 112 of the semiconductor device 110. The array is shown as a four (4) by fifteen (15) array of pillars 115 for clarity. The size of the array, shape of the array, and/or number of pillars 115 may be varied depending on the application as would be appreciated by one of ordinary skill in the art having the benefit of this disclosure. For example, one embodiment may include an array of eight (8) by one hundred and twenty three (123) pillars positioned adjacent to a side of the semiconductor device 110. The array area may be thirteen (13) mm by six (6) mm, the pad size for each pillar may be fifty four (54) microns, and the pad pitch may be sixty (60) microns.

Figure 7A:
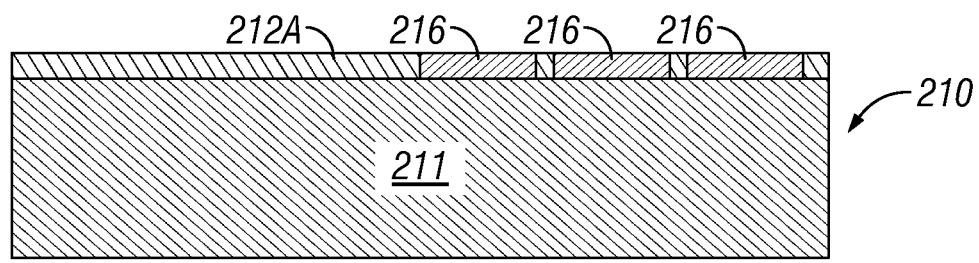
FIG. 7A is a cross-sectional schematic of an embodiment of a semiconductor device.

FIGS. 7A-7E show the formation of one embodiment of a semiconductor device 210. A first layer 212A may be deposited onto a surface of a substrate 211, which may be a silicon substrate, as shown in FIG. 7A. The formation of the first layer 212A may include the formation of a plurality of pads 216, which may be test pads. The number, size, location, and/or configuration of the pads 216 may be varied as would be appreciated by one of ordinary skill in the art having the benefit of this disclosure. The first layer 212A is shown as a single layer for clarity in FIG. 7A. However, the first layer 212A may be comprised of multiple layers deposited onto the surface of the silicon substrate 211 as would be appreciated by one of ordinary skill in the art having the benefit of this disclosure.

Figure 7B:
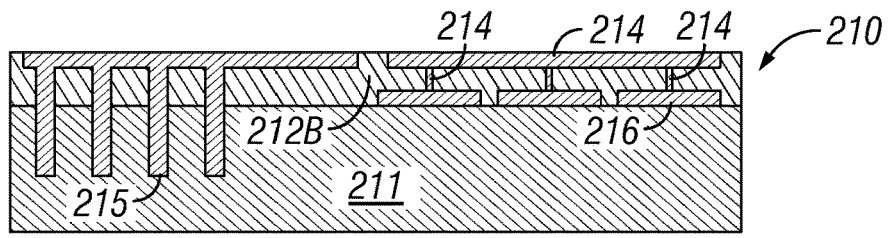
FIG. 7B is a cross-sectional schematic of an embodiment of a semiconductor device.

FIG. 7B shows at least a second layer has been added to the surface of the silicon substrate 211. The layers 212B on the substrate 211 include interconnects, or the like, 214 that will provide electrical connections between various elements, such as the pillars 215 and pads 216, of the semiconductor device 210 as would be appreciated by one of ordinary skill in the art having the benefit of this disclosure. The at least second layer is shown as a single layer for clarity in FIG. 7B to form layers 212B. However, the at least second layer may be comprised of multiple layers deposited onto the surface of the silicon substrate 211 as would be appreciated by one of ordinary skill in the art having the benefit of this disclosure. A plurality of TSVs, or vias, are formed into the layers 212B and extend into a portion of the silicon substrate 211. The TSVs are filled with a conductive material, such as copper, or the like, to form pillars 215, as discussed herein. Various coatings may be applied to the TSVs prior to the depositing of the conductive material, as discussed herein.

Figure 7C:
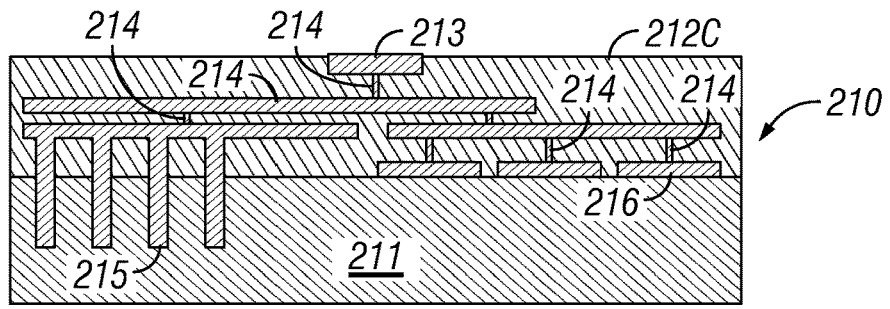
FIG. 7C is a cross-sectional schematic of an embodiment of a semiconductor device.

FIG. 7C shows at least a third layer has been added to the surface of the silicon substrate 211. The layers 212C on the substrate 211 now include at least one pad 213, which provides an electrical connection between the semiconductor device 210 and an adjacent semiconductor device as would be appreciated by one of ordinary skill in the art having the benefit of this disclosure. The at least third layer is shown as a single layer for clarity in FIG. 7C to form layers 212C. However, the at least third layer may be comprised of multiple layers deposited onto the surface of the silicon substrate 211 as would be appreciated by one of ordinary skill in the art having the benefit of this disclosure. As discussed above, at least one pad 213 is formed into the layers 212C. The interconnects 214 electrically connect the pad 213 with both the pillars 215 and the test pads 216.

Figure 7D:
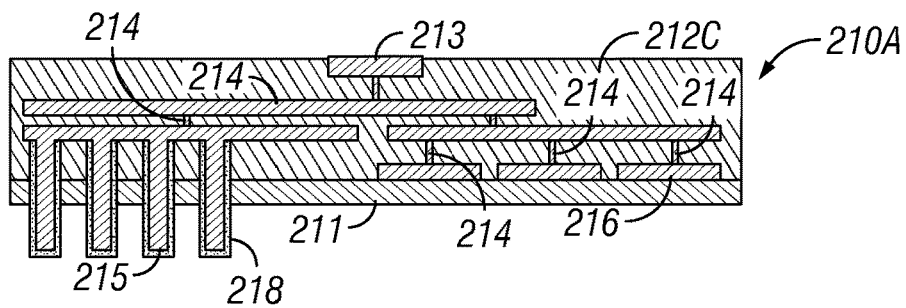
FIG. 7D is a cross-sectional schematic of an embodiment of a semiconductor device.

FIG. 7D shows an embodiment of a semiconductor device or substrate 210A after the formation of the pad 213 shown in FIG. 7C. A portion of the silicon substrate 211 is removed to expose a portion of the plurality of pillars 215 while leaving a portion of the silicon substrate 211 on the bottom of the semiconductor device 210A. Various processes may be used to remove the portion of the silicon substrate 211 as would be appreciated by one of ordinary skill in the art having the benefit of this disclosure. The silicon substrate 211 prevents probing of the pads 216. Instead, the semiconductor device 210A may be tested by probing one or more of the pillars 215. The pillars 215 include an exterior coating 218, which enables the pillars 215 to be probed without causing any marking and/or damage to the inner conductive portion of the pillar 215, as discussed herein. The coating 218 may be various materials as would be appreciated by one of ordinary skill in the art having the benefit of this disclosure. For example, the coating 218 may comprise tantalum. The coating 218 may be removed from the exterior of the pillars 215 after adequate testing of the semiconductor device 210A, as discussed herein.

Figure 7E:
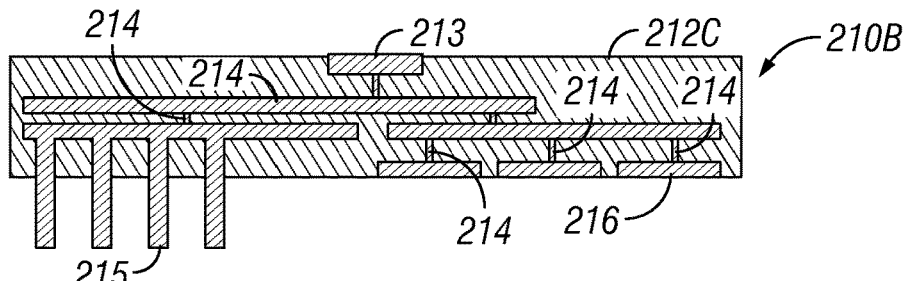
FIG. 7E is a cross-sectional schematic of an embodiment of a semiconductor device.

FIG. 7E shows an embodiment of a semiconductor device or substrate 210B after the formation of the pad 213 shown in FIG. 7C. The silicon substrate 211 has been removed from the bottom of the semiconductor device 210B expose a portion of the plurality of pillars 215 as well as test pads 216. Various processes may be used to remove the portion of the silicon substrate 211 as would be appreciated by one of ordinary skill in the art having the benefit of this disclosure. The semiconductor device 210B may be tested by the probing of one or more of the pads 216. Likewise, the pads 216 may be probed to test other semiconductor devices that may be electrically connected to the semiconductor device 210B via pad 213 on the top surface of the semiconductor device 210B.

Figure 8:
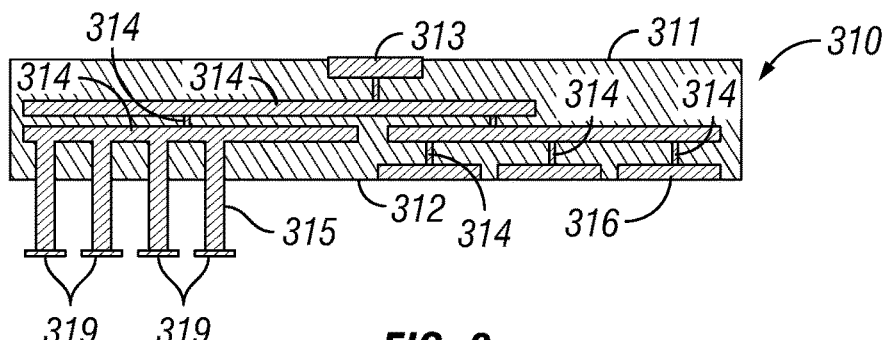
FIG. 8 is a cross-sectional schematic of an embodiment of a semiconductor device.

FIG. 8 shows an embodiment of a semiconductor device or substrate 310. The semiconductor device 310 includes a pad 313 on the top surface and a plurality of pads 316 on the bottom surface. A plurality of pillars 315 extend from the bottom surface of the semiconductor device 310 with a portion of the pillars 315 being positioned within the semiconductor device 310. As discussed herein, the pillars 315 are formed by filling TSVs in the semiconductor device 310 with copper, or the like. The pillars 315 are positioned adjacent to a side of the semiconductor device 310. Interconnections 314 within the semiconductor device 310 electrically connect the pillars 315 with the pad 313 on the top surface. Likewise, the interconnections 314 within the semiconductor device 310 electrically connect the pads 116 on the bottom surface of the semiconductor device 310 with the pad 113 on the top surface as well as the pillars 315. The plurality of pillars 315 include feet 319 located at the end of each pillar 315. The feet 319 may aid in the connection of the pillars 315 to an external device.

Figure 9:
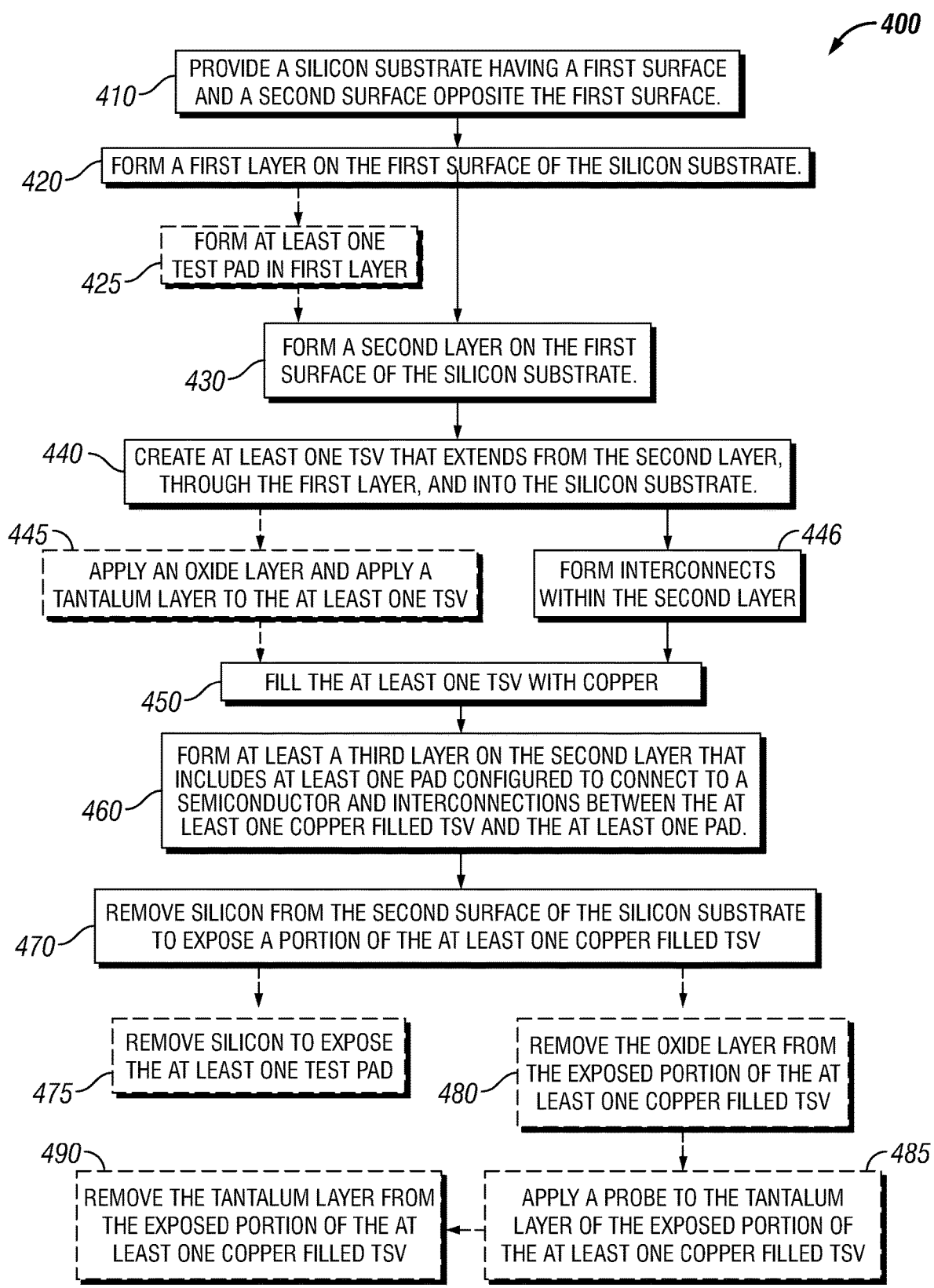
FIG. 9 is a flow chart of one embodiment of a method of making a semiconductor device assembly.

FIG. 9 is a flow chart of one embodiment of a method 400 of making a semiconductor device assembly. The method 400 includes providing a silicon substrate having a first surface and a second surface opposite the first surface, at step 410. The method 400 includes forming a first layer on the first surface of the silicon substrate, at step 420. The first layer may be comprised of multiple layers deposited on the surface of the silicon substrate as would be appreciated by one of ordinary skill in the art having the benefit of this disclosure. At optional step 425, the method 400 may include forming at least one test pad in the first layer, which may be multiple layers, deposited on the surface of the substrate. The method 400 includes forming a second layer on the first surface of the silicon substrate, at step 430. As discussed herein, the second layer may be comprised of multiple layers deposited on the first layer, or first layers, on the silicon substrate as would be appreciated by one of ordinary skill in the art having the benefit of this disclosure.

At step 440, the method 400 includes creating at least one TSV that extends from the second layer, or second layers, through the first layer, or first layers, and into at least a portion of the silicon substrate. The method 400 may include forming a plurality of TSVs, which may be formed in a rectangular array positioned adjacent to a side of the silicon substrate. The method 400 may include forming interconnects within the second layer, or second layers, as discussed herein, at step 446. The method 400 may include applying an oxide layer and applying a tantalum layer to the at least one TSV, at optional step 445. At step 450, the method 400 includes filling the at least one TSV, or the plurality of TSVs, with copper, or the like.

The method 400 includes forming at least a third layer on the second layer, the third layer including at least one pad that is configured to connect to a semiconductor device and forming interconnections between the at least one copper filled TSV and the at least one pad, at step 460. The third layer may be comprised of multiple layers deposited on second layer, or second layers, as would be appreciated by one of ordinary skill in the art having the benefit of this disclosure. The method 400 includes removing silicon from the second or bottom surface of the silicon substrate to expose a portion of the at least one copper, or the like, filled TSV, or a portion of the plurality of copper, or the like, filled TSVs, at step 470. The method 400 may include removing silicon to expose the at least one test pad, at optional step 475. The method 400 may include removing the oxide layer from the exposed portion of the at least one copper, or the like, filled TSV, at optional step 480. The method 400 may include applying a probe to the tantalum layer of the exposed portion of the at least one copper, or the like, filled TSV, at optional step 485. The method 400 may include removing the tantalum layer of the exposed portion of the at least one copper, or the like, filled TSV, at optional step 490.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method of making a semiconductor device comprising:
   providing a silicon substrate having a first surface and a second surface opposite the first surface;
   forming a first layer on the first surface of the silicon substrate;

forming a second layer on the first layer of the silicon substrate;

after forming the second layer, creating at least one through silicon via (TSV), the at least one TSV extending from the second layer, through the first layer, and into the silicon substrate;

filling the at least one TSV with a conductive material, the at least one TSV being positioned adjacent to a side of the silicon substrate;

forming at least a third layer on the second layer, the at least the third layer including at least one pad configured to connect to a semiconductor device and interconnections between the at least one filled TSV and the at least one pad;

removing silicon from the second surface of the silicon substrate to expose a portion of the at least one TSV, wherein removing the silicon further comprises removing silicon from the second surface of the silicon substrate to expose the at least one test pad; and wherein forming the first layer on the first surface of the silicon substrate further comprises forming at least one test pad.

2. The method of claim 1, wherein the conductive material comprises copper.

3. The method of claim 2, further comprising applying an oxide layer to the at least one TSV and applying a tantalum layer to the at least one TSV both prior to filling the at least one TSV with copper.

4. The method of claim 3, further comprising removing the oxide layer from the exposed portion of the at least one copper filled TSV.

5. The method of claim 2, further comprising:

creating a plurality of TSVs, the plurality of TSVs extending from the second layer, through the first layer, and into the silicon substrate;

filling the plurality of TSVs with copper, the plurality of TSVs being positioned adjacent to the side of the silicon substrate;

wherein the third layer includes interconnections between the at least one pad and each TSV of the plurality of copper filled TSVs; and wherein removing the silicon from the second surface of the silicon substrate exposes a portion of each TSV of the plurality of copper filled TSVs.

6. The method of claim 5, wherein creating the plurality of TSVs further comprises form the plurality of TSVs in a rectangular array.

7. A method of making a semiconductor device comprising:

providing a silicon substrate having a first surface and a second surface opposite the first surface;

forming a first layer on the first surface of the silicon substrate;

forming a second layer on the first layer of the silicon substrate;

after forming the second layer, creating at least one through silicon via (TSV), the at least one TSV extending from the second layer, through the first layer, and into the silicon substrate;

filling the at least one TSV with a conductive material, the at least one TSV being positioned adjacent to a side of the silicon substrate, wherein the conductive material comprises copper;

forming at least a third layer on the second layer, the at least the third layer including at least one pad configured to connect to a semiconductor device and interconnections between the at least one filled TSV and the at least one pad;

removing silicon from the second surface of the silicon substrate to expose a portion of the at least one TSV;

wherein forming the first layer on the first surface of the silicon substrate further comprises forming at least one test pad;

applying an oxide layer to the at least one TSV and applying a tantalum layer to the at least one TSV both prior to filling the at least one TSV with copper;

removing the oxide layer from the exposed portion of the at least one copper filled TSV; and applying a probe to the tantalum layer of the exposed portion of the at least one copper filled TSV.

8. The method of claim 7, further comprising removing the tantalum layer from the exposed portion of the copper filled TSV after applying the probe.

* * * * *